United States Patent [19]

Hutter et al.

[11] Patent Number: 4,994,887

[45] Date of Patent: Feb. 19, 1991

[54] HIGH VOLTAGE MERGED BIPOLAR/CMOS TECHNOLOGY

[75] Inventors: Louis N. Hutter, Richardson; Mark E. Gibson, Mesquite; Jeffrey P. Smith, Plano; Shiu-Hang Yan, Richardson; Arnold C. Conway, Garland; John P. Erdeljac, Plano; James D. Goon, Dallas; AnhKim Duong, Garland; Mary A. Murphy, Richardson, all of Tex.; Susan S. Kearney, Tully, N.Y.

[73] Assignee: Texas Instruments Incorporated, Dallas, Tex.

[21] Appl. No.: 120,558

[22] Filed: Nov. 13, 1987

[51] Int. Cl.[5] .................... H01L 27/02; H01L 27/04
[52] U.S. Cl. ........................... 357/43; 357/40; 357/48; 357/90
[58] Field of Search .............. 357/43, 48, 40, 47, 357/49, 50, 90, 92

[56] References Cited

U.S. PATENT DOCUMENTS

| | | | |
|---|---|---|---|
| 3,899,793 | 8/1975 | Wakamiya et al. | 357/48 |
| 4,272,307 | 6/1981 | Mayrand | 357/90 |
| 4,497,106 | 2/1985 | Momma et al. | 357/43 |
| 4,546,370 | 10/1985 | Curran | 357/48 |
| 4,628,341 | 12/1986 | Thomas | 357/48 |
| 4,818,720 | 4/1989 | Iwasaki | 357/43 |
| 4,825,275 | 4/1989 | Tomassetti | 357/48 |

FOREIGN PATENT DOCUMENTS

| | | | |
|---|---|---|---|
| 0139266 | 5/1985 | European Pat. Off. | 357/43 |
| 2603746 | 8/1977 | Fed. Rep. of Germany | 357/48 |
| 2810075 | 9/1978 | Fed. Rep. of Germany | 357/48 |

Primary Examiner—J. Carroll

[57] ABSTRACT

An integrated circuit having PMOS, NMOS and NPN transistors is described for applications in which both digital and analog circuits are required. The integrated circuit is designed to allow standard CMOS cells to be used in the integrated circuit without redesign. A P+ substrate (48) is provided upon which a first P− epitaxy layer (46) is formed. N+ DUF regions (50,52) are provided for the PMOS and NPN transistors, respectively. The base region (68) is formed in an Nwell (58) by implantation and diffusion. Before diffusion, a nitride layer (70) is formed over the base (68) to provided an inert annealing thereof. The base diffusion and collector diffusion occurs before the CMOS channel stop and source/drain diffusions in order to prevent altering diffusion times for the MOS transistors.

3 Claims, 5 Drawing Sheets

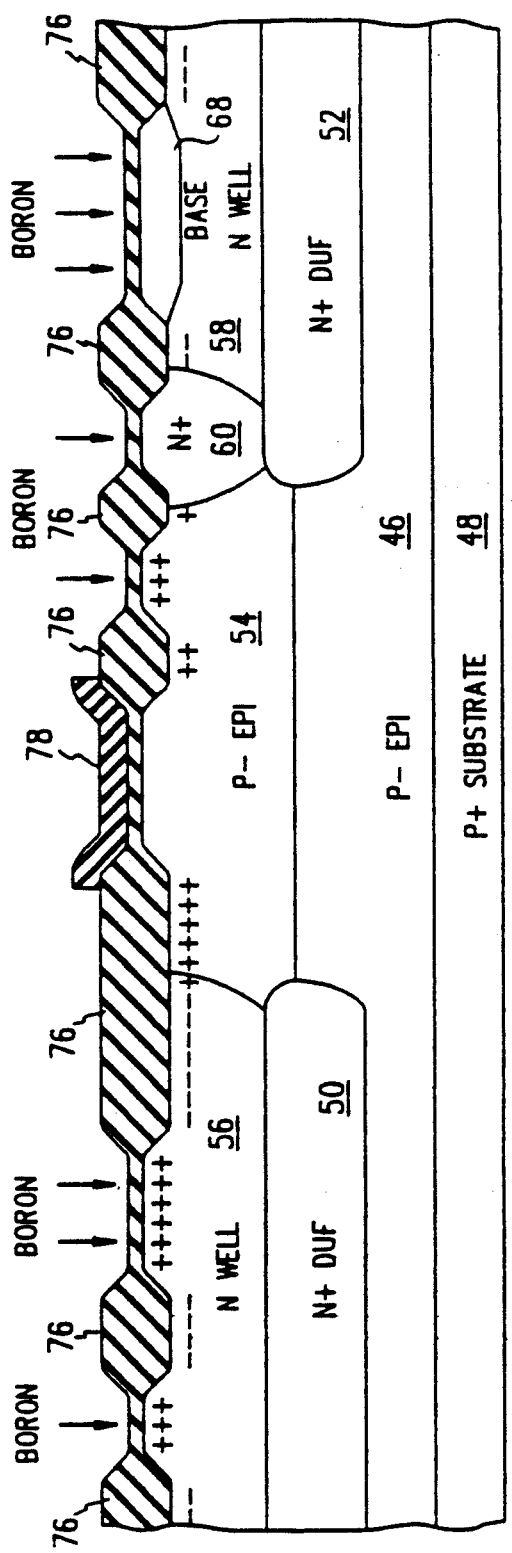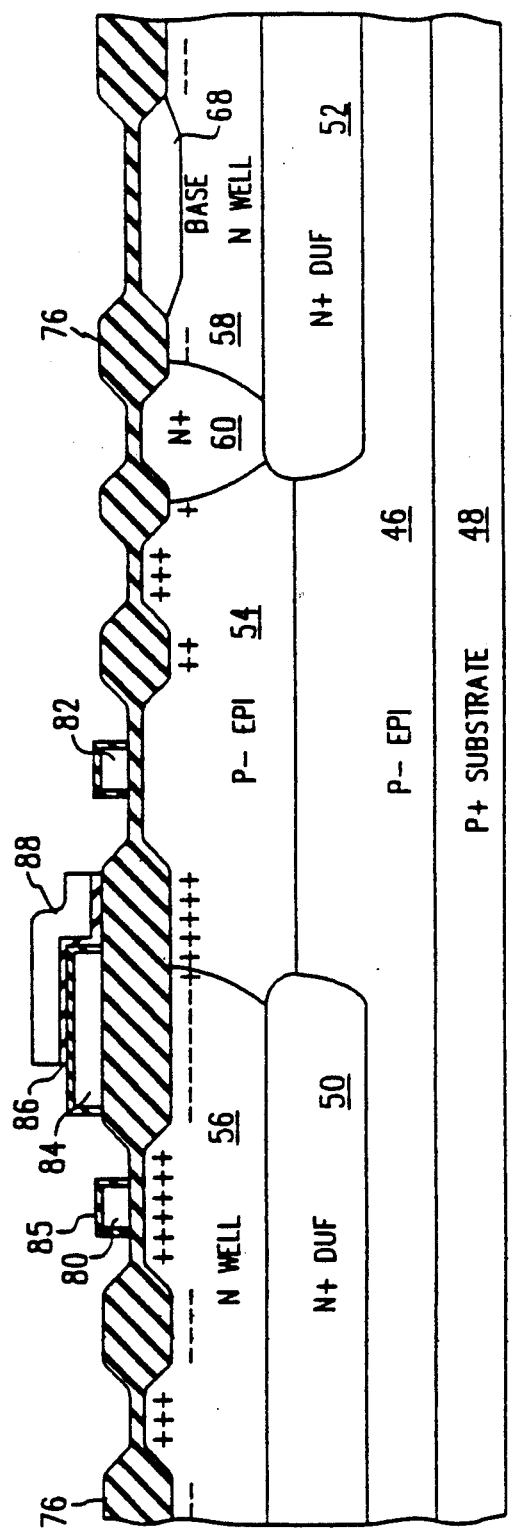
FIG. 6
FIG. 7

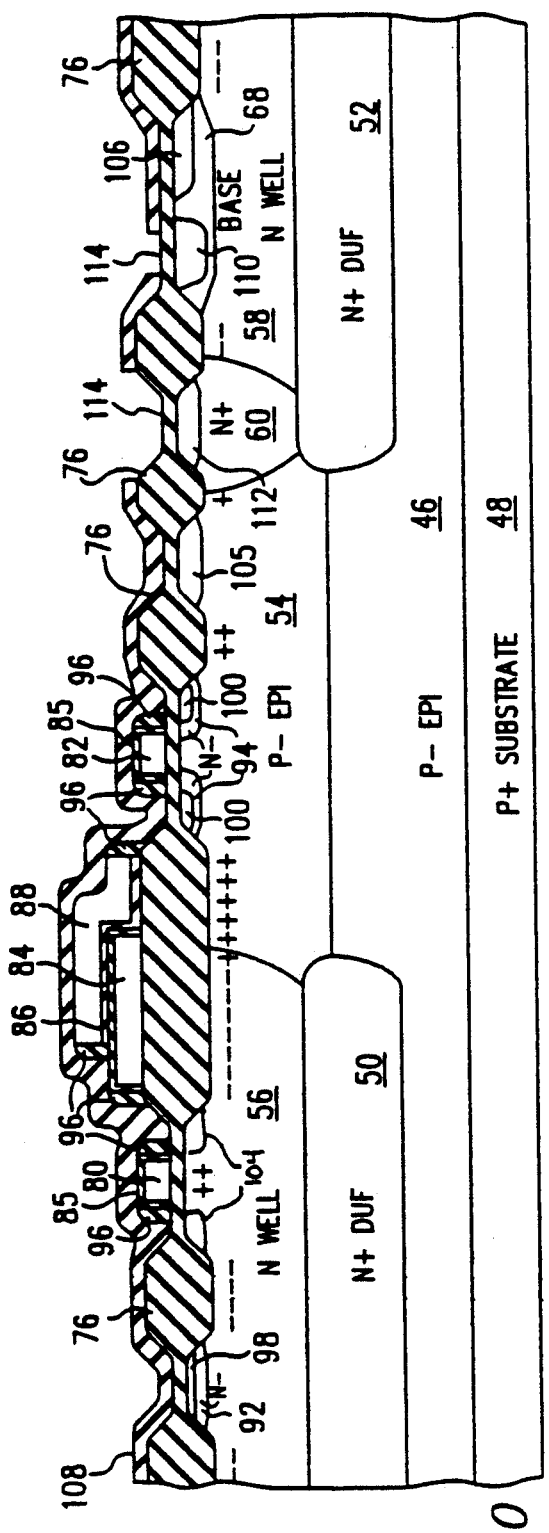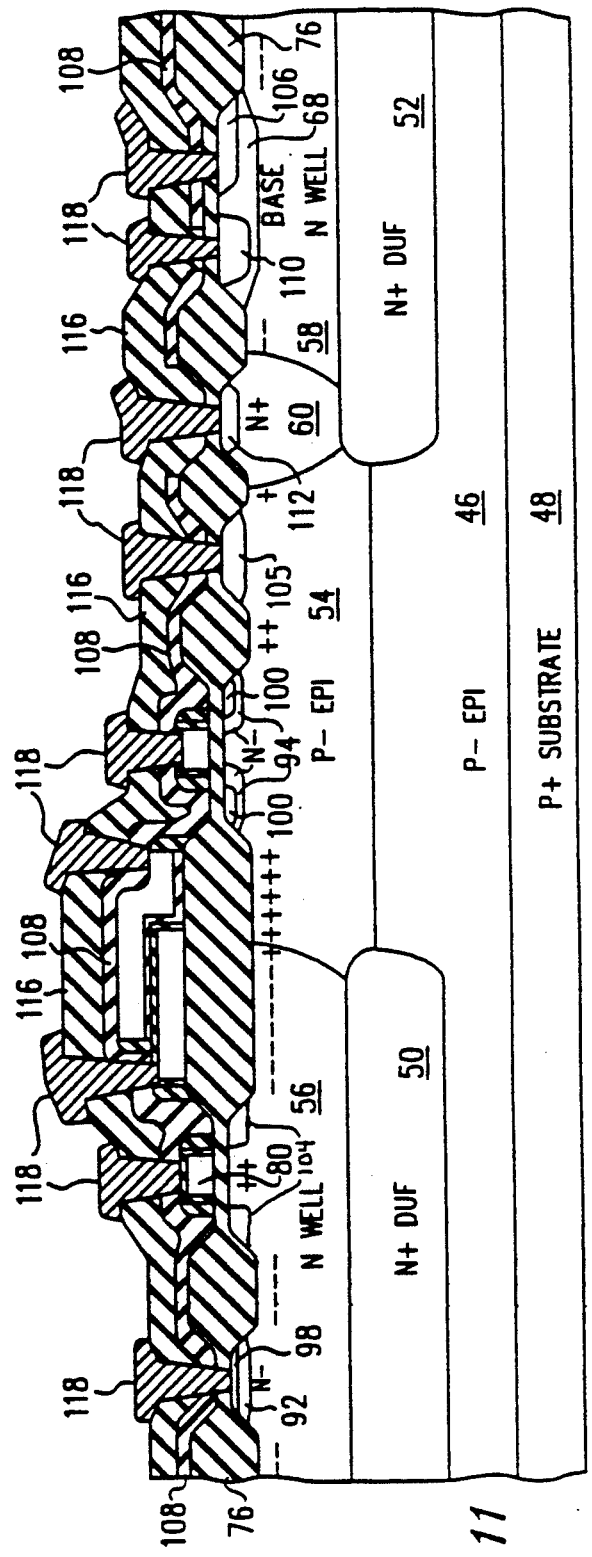
FIG. 10
FIG. 11

HIGH VOLTAGE MERGED BIPOLAR/CMOS TECHNOLOGY

TECHNICAL FIELD OF THE INVENTION

This invention pertains in general to integrated circuits, and more particularly to an Nwell-based merged bipolar/CMOS technology adapted to high voltage linear applications and method of forming the same.

BACKGROUND OF THE INVENTION

A major trend in the electronics industry is to integrate various functions onto a single integrated circuit, thereby increasing performance, reducing system size, and improving system reliability. Many such applications require a combination of analog and digital functions.

To optimize the performance of both analog and digital functions, two semiconductor technologies are desirable. For analog functions, bipolar technology produces superior circuits due to its high voltage capabilities, low noise and faster speed. On the other hand, CMOS technology is generally superior for digital circuits, due to its high component packing density and its low power requirements. In order to optimize both the digital and the analog aspects of an integrated application, merged bipolar/CMOS technologies (hereinafter "BiCMOS") have been developed which allow both technologies to be used in a single integrated circuit.

Two basic BiCMOS processes, a bipolar-based BiCMOS process and a CMOS-based (Nwell-based) BiCMOS process, are typically used. The bipolar-based BiCMOS process has the capability of handling high voltages for analog functions, but suffers from several deficiencies. First, the bipolar devices are optimized at the expense of the CMOS devices, although the CMOS devices are generally the most used device in the integrated circuit; typically, a circuit comprises 80–90% digital functions. Second, the NPN size is larger in the bipolar-based process, due to deep junction isolation. Third, the bipolar-based process mandates a Pwell-CMOS process, which is not the typical choice of ASIC standard cell libraries, since the Pwell-CMOS process optimizes the slower PMOS device at the expense of the faster NMOS device.

The second BiCMOS process, a Nwell-based process, has the advantages of being compatible with many ASIC standard cell libraries, and supplies the NMOS devices with a lightly doped p-epitaxy layer, resulting in fast NMOS devices. Prior art Nwell devices, however, are inadequate for mixed analog-digital applications in which high voltage bipolar devices are necessary. The Nwell process flow sequence does not lend itself to high voltage (greater than five volts) applications without altering the characteristics of the CMOS devices. Furthermore, the Nwell-based process does not provide a low sheet base needed for good analog functions.

Many standard "cells" have been developed for bipolar and CMOS applications. The use of these cells reduces design time and eliminates design errors. However, the standard CMOS cells cannot be used with the prior art BiCMOS processes which are extended to high voltage applications, since the characteristics of the resulting CMOS devices is different than those for which the cells were designed. Recharacterization, or redesign, of the standard cell libraries to accommodate a new process is time consuming and expensive.

Therefore, a need exists in the industry for a BiCMOS technology which is capable of providing high performance analog and digital functions while allowing the use of existing CMOS standard cell libraries as a subset of the BiCMOS library. Furthermore, it is desirable that the bipolar aspect of the BiCMOS technology be capable of handling voltages in the twenty to thirty volt range.

SUMMARY OF THE INVENTION

In accordance with the present invention, an integrated circuit with merged bipolar and CMOS technology is provided which substantially eliminates or prevents the disadvantages and problems associated with prior merged bipolar/CMOS devices.

The integrated circuit of the present invention uses a P+ substrate upon which a P− epitaxy layer is formed. N+ regions are formed in the first P− epitaxy layer. The N+ regions provide a low resistance region for the PMOS transistors and the NPN transistors, while the P+ substrate provides a low resistance region for the NMOS transistors. Alternatively, a P+ region can be formed in the first P− epitaxy layer under the NMOS device, but isolated from the N+ regions.

This aspect of the present invention provides low resistance areas for each of the respective devices, while accommodating high voltage NPN transistors. Prior art twin-well DUF approaches for these low resistance layers have an inherent low breakdown voltage, and produce a high collector to substrate capacitance, due to the proximity of the N+ and P+ regions.

In another aspect of the present invention, the high temperature bipolar diffusion and oxidation cycles are performed before the CMOS active region definition in order to maintain the characteristics of the NMOS and PMOS devices. Importantly, this aspect of the invention provides the technical advantage of allowing standard CMOS cells to be used in the design of the digital-/analog circuits, thereby reducing design time.

In yet another aspect of the present invention, a nitride layer is formed over the surface of the integrated circuit prior to the diffusion of the base regions, in order to act as an oxidation barrier. This aspect of the invention provides an inert anneal, which minimizes damage due to silicon oxidation during the diffusion. Alternatively, the nitride layer can be formed prior to implantation, in order to reduce damage to the silicon during the ion implantation process. It may also be desirable to leave the nitride layer over the base region during other high temperature cycles, such as thermal oxidation.

BRIEF DESCRIPTION OF DRAWINGS

For a more complete understanding of the present invention and the advantages thereof, reference is now made to the following description now taken in conjunction with the accompanying drawings in which:

FIG. 6 illustrates a cross-sectional side view of the LinBiCMOS process of the present invention after a fifth processing stage;

FIG. 7 illustrates a cross-sectional side view of the LinBiCMOS process of the present invention after a sixth processing stage;

FIG. 10 illustrates a cross-sectional side view of the LinBiCMOS process of the present invention after a ninth processing stage; and FIG. 11 illustrates a cross-sectional side view of the LinBiCMOS process of the present invention after a tenth processing stage.

DETAILED DESCRIPTION OF THE INVENTION

The preferred embodiment of the present invention is best understood by referring to FIGS. 1–11 of the drawings, like numerals being used for like and corresponding parts of the various drawings.

Figure 1:
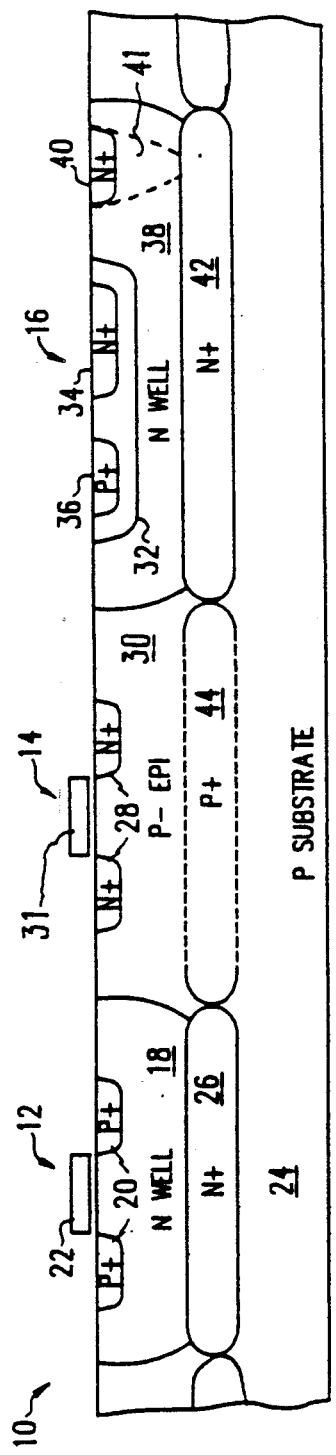
FIG. 1 illustrates a cross-sectional side view of a modified collector diffusion isolation (CDI) BiCMOS technology using an N+ buried collector and a P− epitaxy.

FIG. 1 illustrates a cross-sectional side view of a prior art modified collector diffusion isolation-BiMOS (CDI-BiMOS) technology. The integrated circuit 10 comprises a PMOS transistor 12, a NMOS transistor 14, and a bipolar transistor 16.

The PMOS transistor 12 comprises an Nwell 18 housing P+ source/drain regions 20 bridged by a polysilicon gate 22. The Nwell 18 is separated from a P type substrate 24 by an N+ DUF (Diffusion Under Film) region 26, commonly known as a "buried collector" in bipolar terminology.

The NMOS transistor 14 comprises diffused N+ source/drain regions 28 housed in a P– epitaxy layer 30 formed over the substrate 24. A gate 31 is formed over the N– source/drain regions 28.

The bipolar transistor 16 comprises a P– base region 32 housing an N+ emitter 34 and a P+ contact 36. The base 32 is housed in an Nwell 38, which also houses an N+ contact 40 and an optional deep N+ collector 41. The Nwell 38 is separated from the substrate 24 by a N+ DUF region 42.

An alternate embodiment of the modified CDI-BiMOS technology uses P+ DUF regions 44 wherever N+ DUF regions 42 and 26 are not used, commonly known as a "twin-well" DUF process.

The modified CDI-BiCMOS integrated circuit 10 differs from a conventional CDI-BiCMOS technology in that the N+ DUF regions 26 and 42 are provided under the Nwells 18 and 38, respectively. The purpose of the N+ DUF regions 26 and 42 is twofold. First, the N+ DUF regions 26 and 42 provide a low resistance path through which current can travel. Hence, in the bipolar NPN transistor 16, current flows from emitter 34, through the base 32 and Nwell 38, into the N+ DUF region 42. The current can then pass laterally through the N+ DUF region 42 and return through the Nwell 38 into the contact 40. The low resistance path provided by the N+ DUF region 42 is necessary for high current applications, wherein large voltage drops would otherwise occur across the relatively high resistance Nwell 38.

Secondly, the N– DUF regions 26 and 42 mitigate the effects of a parasitic PNP transistor formed in both the PMOS transistor 12 and the NPN transistor 16. In the PMOS transistor 12, a PNP transistor would be formed by the source/drain regions 20, Nwell 18, and P substrate 24. Likewise, a parasitic PNP transistor formed in the NPN transistor 16 by the P– base 32, the Nwell 38 and the P substrate 24. The parasitic PNP transistor may draw current from the intended devices and inject current into the substrate. Since the substrate is of relatively high resistance, a voltage may develop which will cause devices to turn on inadvertently. The N+DUF regions 26 and 42 act to reduce the gain of the parasitic PNP transistors, mitigating their effect. The optional P+ DUF region 44 lowers the lateral resistance below the N+source/drain region, which reduces the possibility that the lateral parasitic NPN device will turn on into its high gain region.

The modified CDI-BiCMOS technology suffers from several complications. One important problem is the order in which the devices are fabricated using the modified CDI-BiCMOS technology. As heretofore implemented, the channel stop region and field oxidation defining the active devices were formed prior to the heat cycling for the base 32 and deep N+ collector 41, in order to achieve self-alignment of the active regions. Were the CDI-BiCMOS technology used to implement high voltage bipolar devices, the high heat cycling necessary for the deep N+ collector and a deep, heavily-doped base would result in increased channel stop diffusion, changing the CMOS characteristics such as breakdown voltage, capacitance, and device size reductions.

Typically, the CDI-BiCMOS processes either use the existing high P+ source/drain implant, or add a light P– implant dose in the range of 1E12 to 5E13 atoms/cc to form the shallow (0.5–1.0 um) NPN base, while the N+ source/drain region serves as the NPN emitter. While these approaches avoid the adverse consequences of high-heat cycling, the bipolar NPN device performance is degraded. In the former case, the heavy P+ implant dose (mid $10^{15}$ range) produces an extremely low base sheet resistance (approximately 30 ohm/sq) with a high NPN base doping. This high base doping results in low transistor gain (Hfe). Furthermore, the high P+ dose can produce silicon damage leading to unacceptable emitter-base leakage currents. The second method typically generates high base sheet resistances (1000–5000 ohm/sq), which result in higher NPN noise levels, increased NPN Hfe roll-off at high currents, and increased base resistor non-linearity, all of which are important in analog designs.

In order to implement an improved NPN device for analog purposes, a more moderate base sheet (approximately 200 ohm/sq) and base depth (approximately 1.5 microns) are needed. However, the high-temperature base diffusion required in this process would alter the baseline CMOS process, precluding the use of CMOS standard cells. Furthermore the shallow N+ source/drain region can no longer be used as the NPN emitter with this deeper base, as this would significantly lower the Hfe. Hence, a separate deeper emitter process is required, again conflicting with the baseline CMOS process.

A second problem concerns the NMOS transistor 14. Presently, in a twin-well DUF process, a P+ DUF must be used wherever an N+DUF is not used. While this solution is adequate for digital applications wherein high voltages are not present, it is not desirable in analog applications where voltages much over five volts may cause a breakdown between the N+ DUFs and P+ DUFs, since the regions are adjacent. Furthermore, the adjacent N+ and P+ DUF regions increase the collector to substrate capacitance, significantly reducing the speed of the NPN transistor 16.

A third complication with the modified CDI-BiCMOS technology is that the NPN transistor 16 provides a low resistance lateral path by using the N+ DUF 42, but does not provide a low resistance pass between the N+ DUF 42 and the contact 40, thereby increasing the voltage drop in the Nwell 38. Those devices which use the deep N+ region between the N+ DUF 42 and contact 40, form the deep N+ region after the CMOS channel stop implants, thereby altering the CMOS device behavior.

Figure 2:
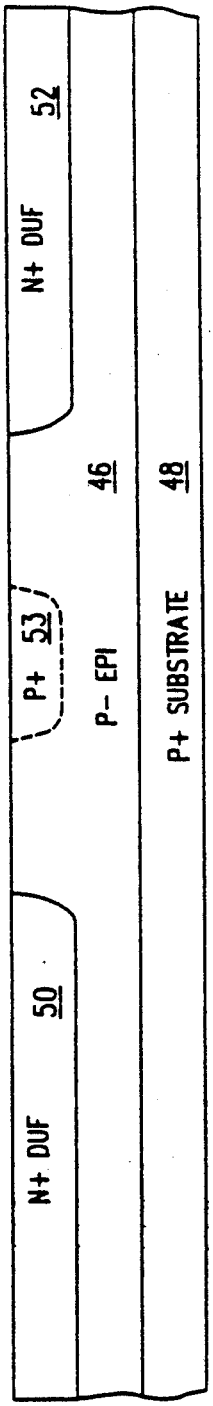
FIG. 2 illustrates a cross-sectional side view of the linear BiCMOS (LinBiCMOS) process of the present invention after a first processing stage.

FIG. 2 illustrates a cross-sectional side view of a first processing stage using a linear BiCMOS (hereinafter "LinBiCMOS") technology. A P− epitaxy layer 46 is formed on a P+ substrate 48. The P− epitaxy layer 46 is oxidized and patterned to define N+ DUF regions 50 and 52. The oxide covering the N+ DUF regions 50 and 52 is removed and the exposed regions of the P− epitaxy layer 46 are implanted with a dopant, such as antimony. The implantations are diffused to form the N+ DUF regions 50 and 52 and the remaining oxide is stripped.

Use of the P+ substrate 48 provides significant advantages over the prior art. As the integrated circuit is processed, the P+ substrate diffuses upwardly into the first P− epitaxy layer 46. The width of the P− epitaxy may be adjusted to vary the final distance between the P+ substrate 48 and the N+ DUF regions 50 and 52; normally a distance of several microns is desirable. After its upward diffusion, the P+ substrate is available to provide a low resistance region for the NMOS devices 14.

Alternatively, a patterned P+ region 53 may be formed in the first P− epitaxy layer 46 to provide the low resistance region. Contrary to the twin-well process, the patterned P+ region is formed beneath the NMOS devices 14, but does not extend to the N+ DUF regions 50 or 52. Thus, low breakdown voltages and high capacitances are not inherent characteristics of the patterned P− region 53.

Figure 3:
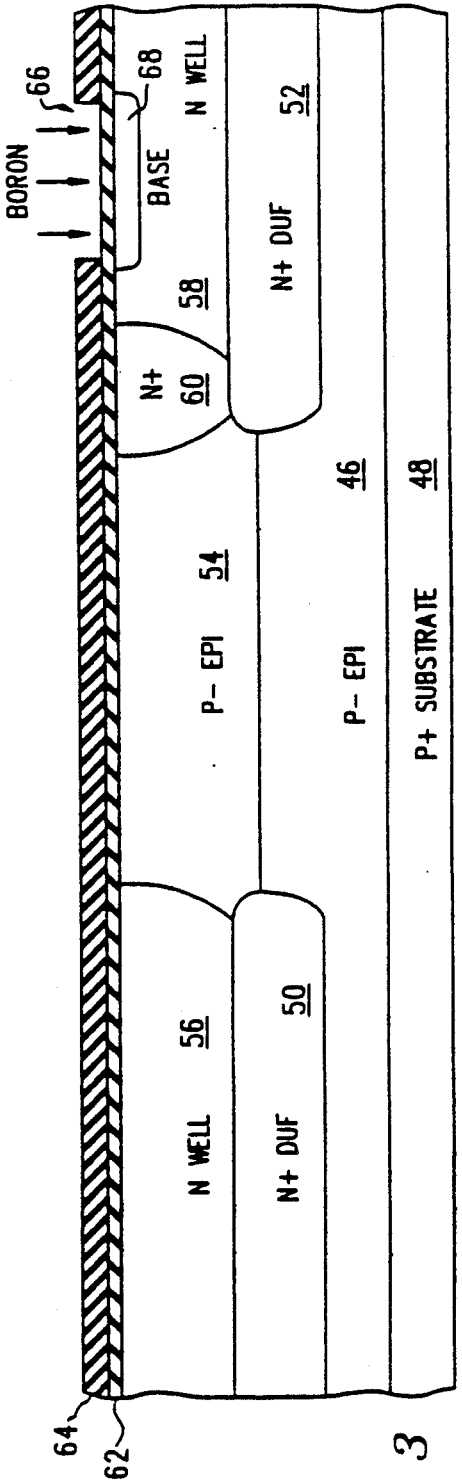
FIG. 3 illustrates a cross-sectional side view of the LinBiCMOS process of the present invention after a second processing stage.

FIG. 3 illustrates a cross-sectional side view of a second stage in the LinBiCMOS technology. A P− epitaxy layer 54 with a thickness in the range of 5-10 microns is formed over the P− epitaxy 46 and N+ DUF regions 50 and 52. The second P− epitaxy layer 54 is oxidized and patterned to define Nwell regions 56 and 58 above the N+ DUF regions 50 and 52 respectively. A N− dopant such as phosphorus may be implanted into the second P− epitaxy layer 54. The implant is diffused into the P− epitaxy 54 to form the Nwell regions 56 and 58. The N+ DUF regions 50 and 52 diffuse upwards into the P− epitaxy 54. Similarly, the P+ substrate 48 diffuses upwards into the P− epitaxy 46.

After the Nwell diffusion, the surface is again patterned and etched to define an N+ collector 60. The N+ collector 60 may be created by a number of techniques known in the art, such as by using a liquid dopant in a furnace deposition and diffusion, or by implantation and diffusion. The deep N+ collector formation involves high temperature cycles, around 1200° C. Therefore, it is important that this process step be performed prior to the active device definition, as described in connection with FIGS. 4-9.

After the N+ collector diffusion, the oxide is stripped, and a pad oxide layer 62 is formed at the surface. A photoresist layer 64 is formed on top of the pad oxide layer 62 and a window 66 defining a base region 68 is formed in the photoresist 64 using photolithographic techniques. A boron implant is performed through the window 66, followed by removal of the photoresist layer 64.

Figure 4:
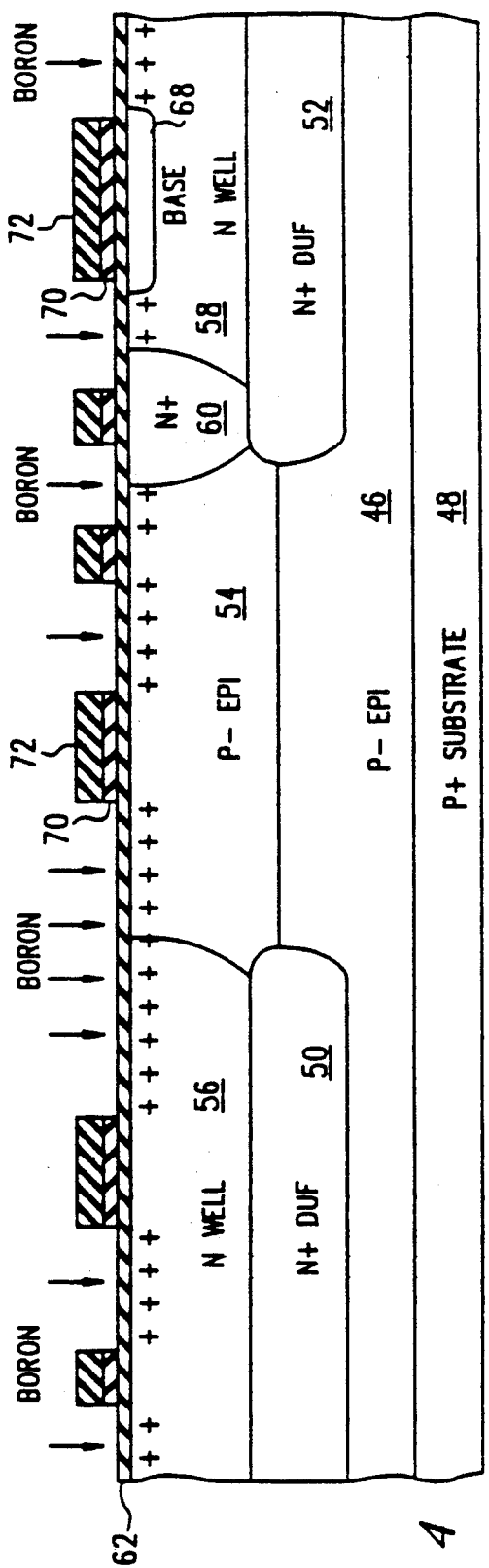
FIG. 4 illustrates a cross-sectional side view of the LinBiCMOS process of the present invention after a third processing stage.

FIG. 4 illustrates a third stage in processing using the LinBiCMOS technology. After removal of the photoresist layer 64, a nitride layer 70 is formed over the pad oxide layer 62. After depositing the nitride layer 70, the boron implant for the base 68 is diffused into the Nwell 58. After the base diffusion, the nitride layer 70 is covered with a photoresist layer 72, and both the photoresist layer 72 and nitride layer 70 are patterned and etched using photolithographic techniques. A boron channel stop implant (denoted by "+" signs) is performed on the exposed areas to provide isolation between active devices.

In an important aspect of the invention, the base diffusion and deep N+ collector formation are performed prior to defining the CMOS transistor regions. Since these diffusions may typically be performed at approximately 1100° C. to 1200° C., any diffused channel stop region or source/drain region would be further diffused, and the characteristics of the devices altered. Thus, the performance of standard cells featuring CMOS transistors would be greatly altered. Thus, the present invention provides the significant technical advantage that all high temperature cycles associated with bipolar devices are performed before formation of the CMOS transistors, allowing the use of standard cells.

In another important aspect of the present invention, diffusion of the base 68 is performed while the nitride layer is covering the surface of the wafer. Since the high temperature diffusion will cause damage to the base 68 if the silicon is allowed to oxidize, the nitride layer 70 seals the base 68 from any oxidizing agents. Thus, the base diffusion using the nitride layer provides an inert diffusion, preventing oxidation of the implanted region and consequential damage therefrom.

Alternatively, the nitride layer 70 may be formed prior to implantation of the base 68. The nitride layer 70 would then act to reduce the speed of the ions at the silicon surface, since the ions would first have to penetrate the nitride layer 70. By reducing the speed of the ions, the damage of the silicon is greatly reduced.

Figure 5:
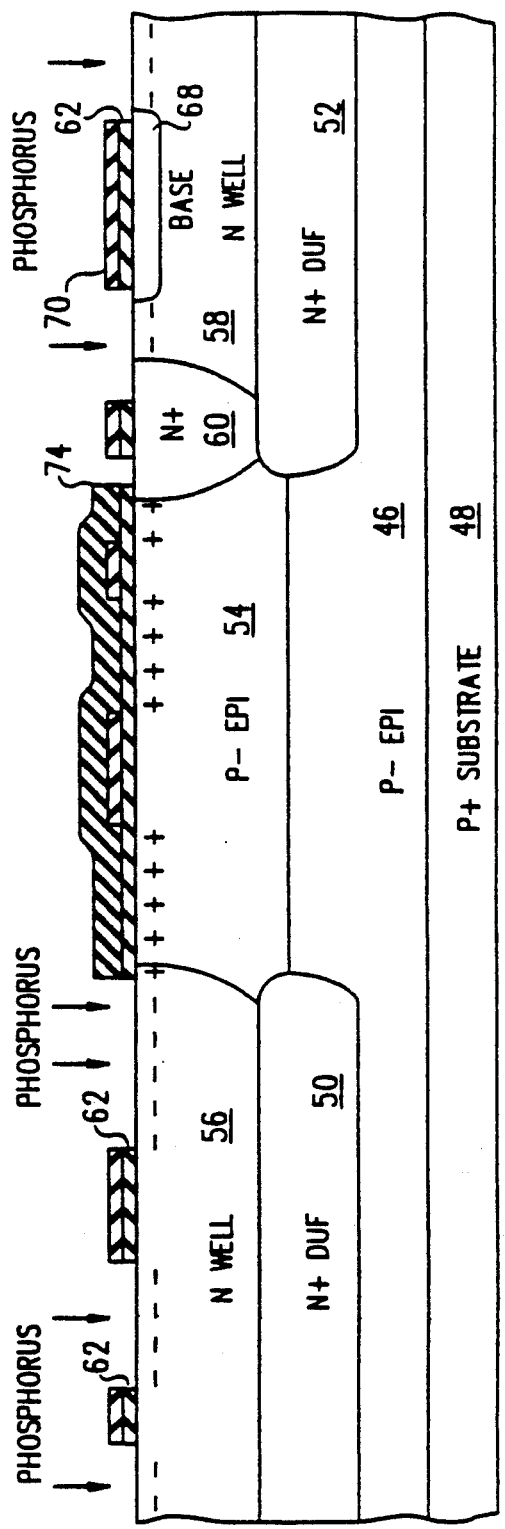
FIG. 5 illustrates a cross-sectional side view of the LinBiCMOS process of the present invention after a fourth processing stage.

Subsequently, as illustrated in FIG. 5, the photoresist layer 72 is removed, and another photoresist layer 74 is formed over the remaining nitride layer 70 and the exposed pad oxide layer 62. A wet etch is performed, such that portions of the pad oxide layer 62 not covered by either the nitride layer 70 or the photoresist layer 74 are removed. A phosphorus channel stop implant (denoted by "−" signs) is performed in the areas where the pad oxide 62 was etched away, thereby providing isolation in the Nwell regions 56 and 58. It should be noted that the order of the phosphorus and boron implants could be reversed, although both are generally necessary for device isolation above 20 volts.

FIG. 6 shows a fifth stage in the LinBiCMOS processing technology. After implanting the channel stop phosphorus, the photoresist layer 74 is removed and the channel stop is diffused. As the phosphorus is diffused, field oxide regions 76 are grown in the area of the Nwell 25 regions 56 and 58 and P− epitaxy layer 54 where the nitride layer 70 was removed, described in connection with FIG. 4. The remaining nitride layer 70 covers the base 68 during the phosphorus channel stop diffusion/thermal oxidation. This provides the advantage that damaged portions of the base 68 are not oxidized during the high temperature cycle associated with this step.

After phosphorus channel stop diffusion/field oxide formation, the remaining nitride 70 is removed, and, if desired, a photoresist mask 78 is formed over the area which will eventually house the NMOS transistor. A boron threshold voltage adjust implant is performed on the areas not masked by either the field oxide region 76 or the photoresist mask 78. The mask 78 is used to create an optional "unimplanted" NMOS device, and is not necessary in the LinBiCMOS process.

Referring now to FIG. 7, a sixth stage in the development of the LinBiCMOS process technology is illustrated. A polysilicon layer is deposited and doped on the surface of the wafer, and is patterned and etched to form gates 80 and 82 for the PMOS and NMOS transistors respectively. At this time, the polysilicon layer may also be used to form a first plate 84 for a capacitor. An interlevel oxidation is used to form a thin oxide layer 85 over the gates 80 and 82 and the first plate 84. If a capacitor is to be formed, a nitride deposition, oxidation and polysilicon deposition and implantation are performed successively, and the deposited layers are patterned and etched to form an interlevel nitride layer 86 and a second plate 88.

Figure 8:
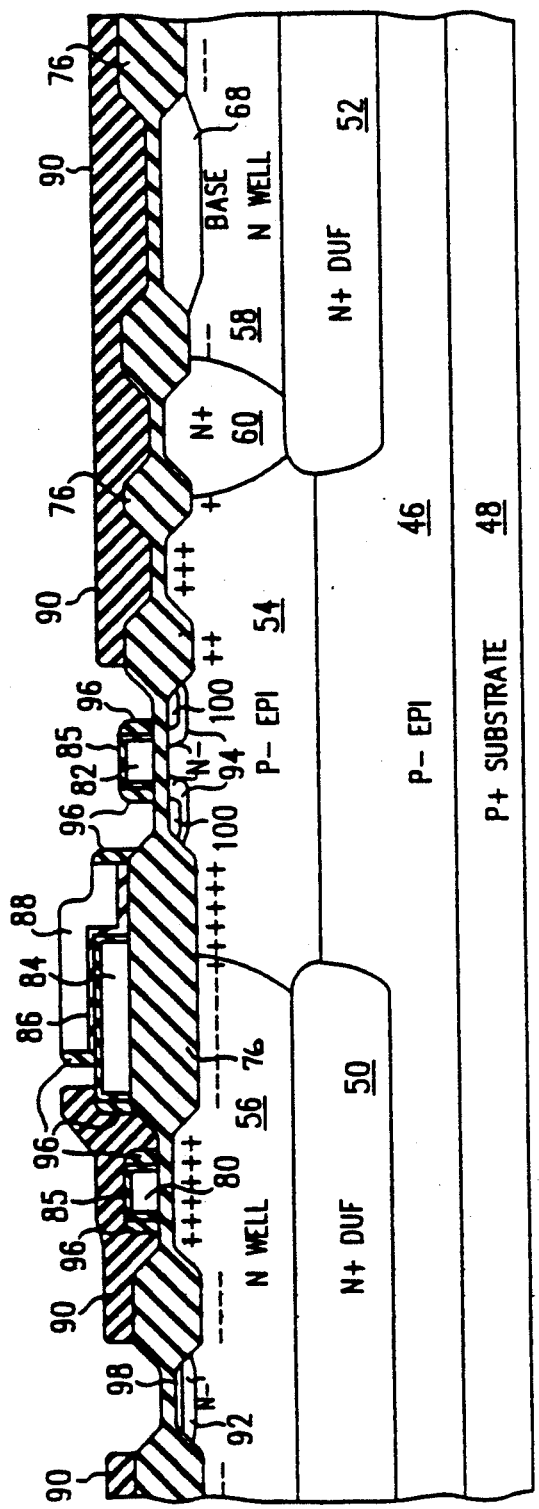
FIG. 8 illustrates a cross-sectional side view of the LinBiCMOS process of the present invention after a seventh processing stage.

FIG. 8 illustrates a seventh stage in the LinBiCMOS process technology. A photoresist layer is formed on the surface of the wafer and is patterned and etched to form photoresist mask 90 exposing areas in which an N− implant is desired. Typically, the N− implant can be implemented by implanting a light phosphorus dose in the range of $10^{13}$. The N− implant is use to form the N− backgate contact 92 for the Nwell region 56 and the N− source/drain regions 94 of the NMOS transistors. The N− regions 94 reduce the electric field at the drain end of the NMOS device, thus providing a reduction of "hot electron" degradation.

A conformal oxide deposition and subsequent anisotropic etch are performed forming sidewall oxide regions 96. Subsequently, the photoresist mask 90 is reapplied and an N+ implant is performed which results in an N+ backgate contact region 98 on top of the N− backgate contact region 92 and N+ source/drain regions 100 on top of the N− source/drain regions 94. Subsequently, an anneal is performed on the N+ and N− implants.

Figure 9:
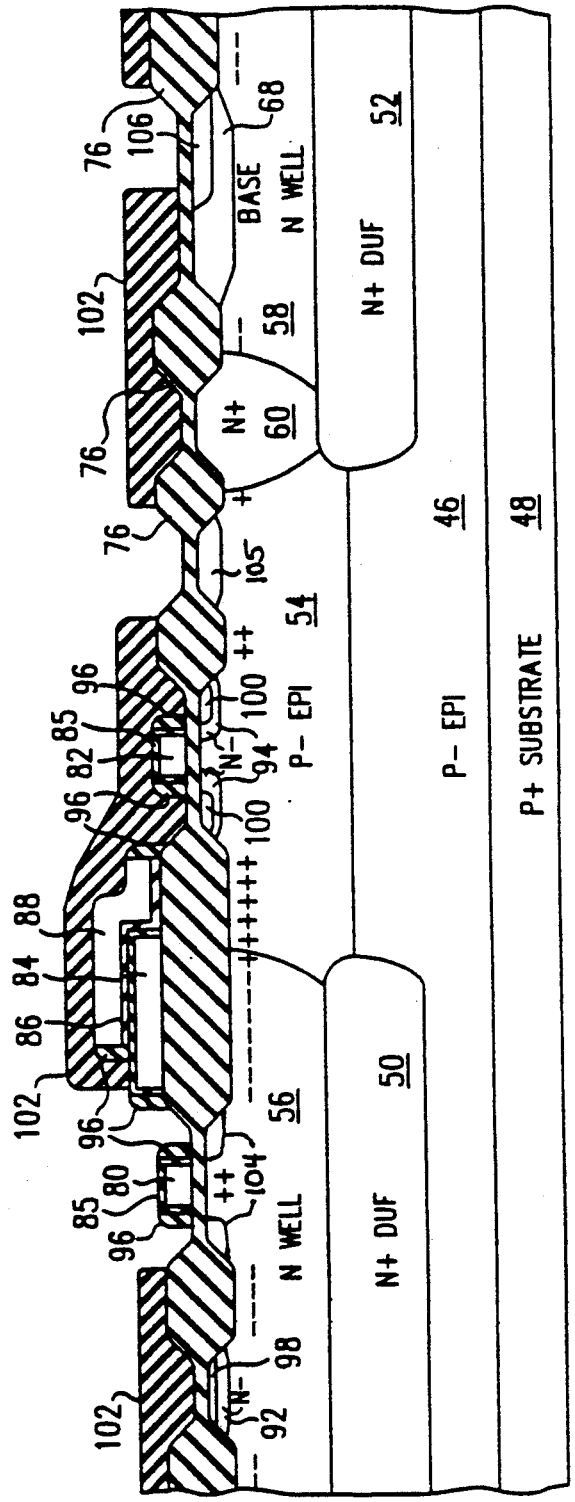
FIG. 9 illustrates a cross-sectional side view of the LinBiCMOS process of the present invention after a eighth processing stage.

FIG. 9 illustrates an eighth stage in the LinBiCMOS process technology. The photoresist masks 90 are removed, and a new photoresist layer is patterned and etched to form masks 102 for a P+ source/drain implant. A boron implant may be used to form the P+ source/drain regions 104, backgate contact 105, and the base contact region 106.

Referring now to FIG. 10, a ninth stage in the LinBiCMOS process technology is illustrated. After removal of the photoresist masks 102, a low-temperature oxide layer 108 is deposited over the surface of the wafer. Before etching the oxide layer 108, a standard P+ anneal is performed to activate the P+ implantation described in connection with FIG. 9 as well as to densify the deposited oxide.

After the anneal, the oxide layer 108 is patterned and etched, exposing the N− collector 60 and the area in which the emitter 110 is to be formed. An emitter deposition/diffusion is performed which forms the emitter 110 and a collector contact 112. Subsequently, a thermal oxidation is performed to create a thin oxide 114 over the emitter 110 and the collector contact 112. The heat cycle involved in the emitter deposition/diffusion is relatively mild, and does not affect the characteristics of the MOS transistors. The heat cycling involved in the emitter diffusion may be performed in conjunction with the P+ anneal, such that no extra heat cycling is added to the standard CMOS flow.

Alternatively, the emitter could be formed in the same step as the N+ and/or N− source/drain formation. While these alternatives save a masking step, the resulting emitter may be shallower than desirable, leading to lower gain or the need for a higher base resistance.

FIG. 11 illustrates a final step in the LinBiCMOS process technology. A doped glass layer 116 is deposited on the surface of the wafer and densified. The doped oxide layer 116 is patterned and etched, along with intervening oxide layers, to expose the diffused regions. Contacts 118 are formed in the etched portions by a metal deposition.

The LinBiCMOS process has been described in conjunction with PMOS, NMOS, NPN, and low voltage capacitor structures; however, standard devices such as lateral and substrate PNP transistors, resistors, diodes, and other devices may be built in this process using standard techniques known to those skilled in the art.

Although a preferred embodiment of the present invention has been described in detail, it should be understood that various changes, substitutions and alterations can be made therein without departing from the spirit and scope of the invention as defined by the appended claims.

What is claimed is:

1. An integrated circuit having NMOS, PMOS, and NPN transistors comprising:
   a first P type layer;
   N+ buried regions formed insaid first P type layer corresponding with the PMOS transistors and the NPN transistors;
   a second P type layer overlying said first P type layer and housing the NMOS transistors;
   N well regions formed in said second P type layer each of said N well regions housing a PMOS transistor or a bipolar transistor; and
   P+ buried regions disposed between said first and second P type layers and beneath the NMOS transistors, and P+ buried regions being substantially smaller than said N+ buried regions and being isolated from said N+ buried regions thereby forming an integrated circuit in which PMOS transistors are in an N well, which N well is on an N+ region, and in which NMOS transistors are on P type layers, which P type layers are on a P+ region, and in which NPN transistors are in an N well, which N well is on an N+ region, and in which the P+ regions are isolated from the N+ regions, whereby the N+ regions provide a low resistance region for the PMOS and NPN transistors and the P+ region provides a low resistance region for the NMOS transistors, and the isolation of the P+ regions from the N+ regions avoids high capacitance due to proximity of N+ and P+ regions.

2. The integrated circuit of claim 1, wherein said first P type layer is a first epitaxial layer, and said second P type layer is a second epitaxial layer.

3. An integrated circuit having NMOS, PMOS, and bipolar transistors, comprising:
   a P+ layer of semiconductor material;
   a first P layer of semiconductor material on a surface of said P+ layer;
   a second P layer of semiconductor material on said first P layer and having an interface with said first P layer, and separated from said P+ layer by said first P layer;
   N+ regions at the interface of said first and second P layers and spaced from said P+ layer;
   first and second N regions in said second P layer, each of said N regions adjacent a corresponding one of said N+ regions;
   N source and drain regions in said second P layer for an NMOS transistor;
   P source and drain regions in said first N region for a PMOS transistor; and
   a P base region in said second N region, and an N emitter region in said P base region for a bipolar transistor with said second N region as collector.

* * * * *